(12) United States Patent
Negishi et al.

(10) Patent No.: US 7,040,526 B2
(45) Date of Patent: May 9, 2006

(54) ELECTRONIC PARTS ASSEMBLING AND TESTING METHOD, AND ELECTRONIC CIRCUIT BASEBOARD MANUFACTURED BY THE METHOD

(75) Inventors: Takashi Negishi, Hadano (JP); Katsuhiko Mukai, Odawara (JP); Hiromitsu Nakagawa, Hadano (JP)

(73) Assignee: Ricoh Company, Ltd., Tokyo (JP)

( * ) Notice: Subject to any disclaimer, the term of this patent is extended or adjusted under 35 U.S.C. 154(b) by 215 days.

(21) Appl. No.: 10/235,826

(22) Filed: Sep. 6, 2002

(65) Prior Publication Data

US 2003/0042289 A1    Mar. 6, 2003

(30) Foreign Application Priority Data

Sep. 6, 2001  (JP) ............................ 2001-270597
Sep. 21, 2001 (JP) ............................ 2001-290198

(51) Int. Cl.
*B23K 31/12* (2006.01)

(52) U.S. Cl. ................. 228/103; 324/754; 324/765

(58) Field of Classification Search ............... 228/103, 228/102, 9, 180.1, 180.22; 324/754, 758, 324/757, 765
See application file for complete search history.

(56) References Cited

U.S. PATENT DOCUMENTS

| | | | | |
|---|---|---|---|---|
| 4,574,235 A | * | 3/1986 | Kelly et al. ................. 324/754 |
| 4,696,101 A | * | 9/1987 | Vanzetti et al. ............... 29/740 |
| 5,134,665 A | * | 7/1992 | Jyoko ......................... 382/150 |
| 5,198,756 A | * | 3/1993 | Jenkins et al. .............. 324/757 |
| 5,295,621 A | * | 3/1994 | Tsujimoto et al. ......... 228/219 |
| 5,493,594 A | * | 2/1996 | Hamada et al. ............... 378/34 |
| 5,527,628 A | * | 6/1996 | Anderson et al. ........... 428/647 |
| 5,555,316 A | * | 9/1996 | Tsujikawa et al. ......... 382/150 |
| 5,631,573 A | * | 5/1997 | Ohno ......................... 324/754 |
| 5,789,280 A | * | 8/1998 | Yokota ....................... 438/123 |
| 5,854,513 A | * | 12/1998 | Kim .......................... 257/737 |
| 5,877,033 A | * | 3/1999 | Matern ........................ 438/14 |
| 6,123,248 A | * | 9/2000 | Tadauchi et al. ......... 228/111.5 |
| 6,464,122 B1 | * | 10/2002 | Tadauchi et al. ............ 228/1.1 |

(Continued)

FOREIGN PATENT DOCUMENTS

JP        2001-53436      *   2/2001

OTHER PUBLICATIONS

U.S. Appl. No. 10/971,003, filed Oct. 25, 2004, Takahashi et al.

(Continued)

*Primary Examiner*—Jonathan Johnson
(74) *Attorney, Agent, or Firm*—Oblon, Spivak, McClelland, Maier & Neustadt, P.C.

(57) ABSTRACT

A method for assembling and testing an electronic circuit baseboard includes at least a step of soldering at least one electronic part to an electronic circuit baseboard using Pb excluded solder. One of erroneous wiring, erroneous mounting, malfunction, and defective soldering of the least one electronic part is tested by contacting a probe pin to various probe pin contact sections on the electronic circuit baseboard. During the step of soldering, the Pb excluded solder is also supplied to at least one of the various probe pin contact sections in order to suppress oxidation thereof.

9 Claims, 13 Drawing Sheets

U.S. PATENT DOCUMENTS

| | | | |
|---|---|---|---|
| 6,476,332 B1 * | 11/2002 | Shangguan | 174/261 |
| 6,476,487 B1 * | 11/2002 | Kuramoto et al. | 257/738 |
| 6,486,686 B1 * | 11/2002 | Fukasawa | 324/754 |
| 6,495,441 B1 * | 12/2002 | Kitajima et al. | 438/616 |
| 6,672,500 B1 * | 1/2004 | Caletka et al. | 228/103 |
| 6,797,924 B1 * | 9/2004 | Axinte et al. | 219/234 |
| 2003/0042289 A1 | 3/2003 | Negishi et al. | |

OTHER PUBLICATIONS

U.S. Appl. No. 11/153,457, filed Jun. 16, 2005, Nakagawa et al.

* cited by examiner

- LAND 31
- PARTS 32
- ELECTRODE 33
- WIRING ON PWB 34
- NEEDLE CONTACT SECTION 35 WHERE SOLDER IS SUPPLIED TO TEST LAND

- TEST LAND 41
- SOLDER COAT 42
- HEAT RESISTANT PREFLUX 43
- PWB 40
- PREFLUX 42'

ELECTRODE 71

RESISTANCE 72 OF 10 kΩ
(CORRECT CONDITION)

ELECTRODE 71

RESISTANCE 73 OF 1kΩ
(ERRONEOUS PARTS CONDITION)

PARTS 72
POLARITY MARK 74

ELECTRODE 71

ELECTRODE 71

PARTS BODY 91 / PARTS LAND 93
PARTS LEAD 92

91    92   93
SOLDER SHORT 92

FIG. 10A

| FIG. 10 | FIG. 10A |
|---|---|
| | FIG. 10B |
| | FIG. 10C |

| CHARACTERISTIC ITEM / METAL ALLOY TYPE | MELTING POINT | MACHINE PROPERTY | WETTING PERFORMANCE | OXIDATION PERFORMANCE | PROCESSING PERFORMANCE | COST | CHARACTERISTICS |
|---|---|---|---|---|---|---|---|
| Sn-Ag SERIES (Sn-Ag-Cu SERIES, Bi-NONE) | △ | ◎ | △ | ○ | ○ | △ | MOTHER BODY METAL ALLOY HAVING BOTH LONG ACTUAL CREDENTIAL AS HIGH TEMPERATURE SOLDER AND EXCELLENT MECHANICAL PERFORMANCE, COVERING A PERFORMANCE USING APPENDAGE. |
| Sn-Ag SERIES (Sn-Ag-Cu-SMALL QUANTITY OF Bi) | △ | ○ | ○ | ○ | △ | △ | THE MOST EXCELLENTLY BALANCED SERIES/ PROCESSING AND EXPANSION TO STRING SOLDER ARE DIFFICULT. |

FIG. 10B

| | | | | | | |
|---|---|---|---|---|---|---|
| Sn-Ag SERIES (Sn-Ag-Cu-SLIGHTLY LARGE QUANTITY OF Bi) | O | △ | O | O | △ | △ | AS "Bi" AMOUNT INCREASE A PROBLEM OCCURS IN A TOTAL MECHANICAL PERFORMANCE. |
| Sn-Cu SERIES | △ | ◎ | △ | O | O | O | AN EXCELLENT METAL ALLOY SERIES FROM COST & MECHANICAL PROPERTY POINT OF VIEW/ITS HIGH MELTING POINT IS A PROBLEM. |
| Sn-Zn SERIES | ◎ | O | △ | △ | △ | O | ITS MELTING POINT IS BOUNDLESSLY CLOSE TO THAT OF A Sn-Pb CRYSTAL, AND THUS ATTRACTIVE/ IT HAS A HEAVY DEFECT IN ITS OXIDATION PERFORMANCE. |

ELECTRIC MATERIAL PROPERTY

ELECTRONIC PARTS ASSEMBLING AND TESTING METHOD, AND ELECTRONIC CIRCUIT BASEBOARD MANUFACTURED BY THE METHOD

CROSS-REFERENCE TO RELATED APPLICATIONS

This application claims priority under 35 USC §119 to Japanese Patent Application Nos. 2001-270597 and 2001-290198 filed on Sep. 6, 2001, and Sep. 21, 2001, respectively, the entire contents of which are herein incorporated by reference.

BACKGROUND OF THE INVENTION

The present invention relates to a method for assembling and testing electronic parts using Pb-free (lead-free) solder alloy, and an electronic circuit baseboard manufactured and tested by the method.

In particular, the present invention relates to an electronic circuit baseboard assembling and testing method capable of precisely testing conduction of the parts using a test land while suppressing oxidation thereof.

In the past, an Sn—Pb (tin-lead) type solder, including a large quantity of Pb (lead), is generally utilized when electronic parts are mounted. However, when an electronic circuit baseboard is soldered with an Sn—Pb type solder and the lead is discarded, the solder sometimes fuses out therefrom, giving undesirable effects to an ecological system and thereby causing environmental pollution. As a result, usage of a Pb-free type solder alloy is highly desirable.

After investigations of various Pb-free solder alloys; three components such as an Sn—Ag—Bi (tin-silver-bismuth) based material is a prevailing candidate for a Pb-free type solder alloy rather than an Sn—Pb type solder.

The reason is that various compositions formed by a two-component type solder alloy have already been examined as Pb-free solder alternatives. For example, since Sn-3,5 weight % Ag has a fusing point of 221° C. and Sn-5 weight % Sb (antimony) has a fusing point of 199° C., respectively, these fusing points are too high in comparison to the Sn-37 weight % Pb solder alloy. The Sn-37 weight % Pb has a fusing point of 183° C.

Accordingly, these two component type materials are not employed as Pb-free solders for a conventional glass epoxy baseboard. In addition, even though Sn-9 weight % Zn (zinc) has a low fusing point of 199° C., the solder's surface is easily oxidized. The solder's surfaces wetting performance, with regard to an electrode comprising Cu (copper) or Ni (nickel) is particularly low in comparison to that of an Sn—Ag or Sn—Sb type solder. As a result, Sn-9 weight % Zn is not employed either as a Pb-free type solder. Furthermore, since Sn-58 weight % Bi has a fusing point of 138 C and is hard and brittle, this two component type alloy has problems associated with its structural integrity and is thus difficult to employ. Sn-52 weight % In (indium) also has a low fusing point of 117° C. relative to Sn-37 weight % Pb which has a fusing point of 183° C., This difference in fusing point temperatures causes an additional problem of a weakening intensity in the solder connection section at high temperatures. In contrast, the fusing point can be approximated more closely, to 183° C. (e.g. the fusing point of Sn-37 weight % Pb) when a three component type Pb-free alloy, such as Sn—Ag—Bi is employed, as compared to when a two component type Pb-free alloy is employed.

However, when seeking prescribed materials whose fusing points approximate 183° C., in the three component type Pb-free alloy, a perfect eutectic composition is not obtained. A composition should have a solid and liquid coexisting temperature (e.g. a solid phase line temperature lower than 183° C. and a liquid phase line temperature higher than 183° C.). Thus, when a flow soldering process is performed after parts are connected by a reflow soldering process, and air-cooling is performed without a blower for the baseboard, the respective temperatures decline at different rates in these added parts and the baseboard, As a result, a large temperature difference arises in the solder of the connecting sections since the connected parts have different heat capacities from that of the glass epoxy baseboard. In these situations, when a solder having a wide temperature range of a solid and liquid coexistence is utilized, the solder coagulates, because a phase having a low fusing point (e.g., a hard and brittle phase largely including Bi) is segregated at a higher temperature side. As a result, the connection strength of various parts which complete the segregation phase after receiving a reflow soldering process is readily weakened.

To resolve such a problem, an Sn—Ag—Cu three composition type PB free solder alloy, which is excellent at solder connection credibility, can be used. However, a melting point of the Su—Ag—Cu solder alloy is 217° C. and is still considerably higher than that of conventional Sn-37 mass % Pb having a melting point 183° C. Thus, when such a higher melting point solder is coated on a land, formed from a copper leaf of an electronic circuit baseboard, the copper leaf section is easily oxidized, and a wetting performance of such a solder is low. As a result, there exists difficulty in testing electrical conduction of an electronic parts by contacting a tester to the land after soldering.

SUMMARY OF THE INVENTION

Accordingly, an object of the present invention is to address and resolve the above-noted and other problems and provide a new electronic parts assembling and testing method. The above and other objects are achieved according to the present invention by providing a novel method for assembling and testing electronic circuit baseboard including steps of soldering various parts to an electronic circuit baseboard using solder excluding Pb, and testing one of erroneous wiring, erroneous mounting, malfunction, and defective soldering of the parts. The testing method is performed by contacting a pair of probe pins to various probe pin needle contact sections on the electronic circuit baseboard, and testing electric conduction therebetween. In addition, the Pb excluding solder may be supplied to the probe pin contact section in a soldering step.

In another embodiment, a shape of solder supplied to a test land, serving as a probe needle contact section, is substantially the same to that of the test land.

In yet another embodiment, the Pb excluding solder is an Sn—Ag—Cu type alloy.

In yet another embodiment, a step of soldering is performed in an inert ambient atmosphere.

In yet another embodiment, solder supplied to a test land is a different type from that supplied to a parts electrode soldering section.

In yet another embodiment, the different type solder includes either an Sn—Pb alloy, or Pb excluding solder having substantially the same wetting performance to the Pb including material.

In yet another embodiment, a coat made of highly heat resistant pre-flux is formed on the land of the electronic circuit baseboard so as to prevent oxidation during soldering.

In yet another embodiment, flux having oxidation and reduction functions and capable of successively decomposing and evaporating is utilized during the soldering.

In yet another embodiment, various probe pins having various shapes may be selectively used so as to properly contact various needle contact sections of leads, surface mounting parts, or the like in accordance with a shape and condition thereof.

BRIEF DESCRIPTION OF DRAWINGS

A more complete appreciation of the present invention and many of the attendant advantages thereof will be readily obtained as the same becomes better understood by reference to the following detailed description when considered in connection with the accompanying drawings, wherein:

FIGS. 5A–5D are side views of probe pins for illustrating various shapes formed in accordance with shapes and conditions of a test land, an electrode, and soldering material, and the like;

FIGS. 10A, 10B, and 10C are charts for collectively illustrating various Pb free solder types and corresponding characteristics;

FIG. 151B is a top view of the lead part shown in FIG. 5A;

DETAILED DESCRIPTION OF THE PREFERRED EMBODIMENT

Figure 1A:
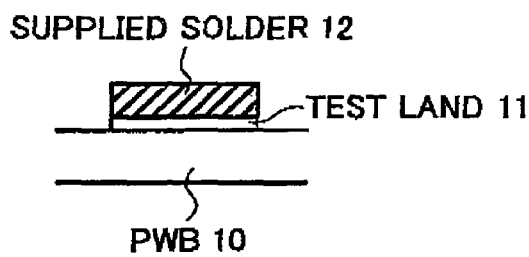
FIG. 1A is a side view of a printed wiring board (PWB) showing solder of substantially the same size and shape applied to a test land in accordance with an exemplary embodiment of the invention.

Referring now to the drawings, wherein like reference numerals designate like elements throughout the several views, a first embodiment is now described with reference to FIGS. 6–8, and 12. Generally, a step of confirming quality of assembly is important for an electronic circuit baseboard after various parts are soldered thereto.

When conventional Pb based solder is utilized, below described errors are typically detected at the conclusion of the assembly process. Specifically, such errors may include, but are not limited to, erroneous wiring design, erroneous wiring, part misplacement/faulty orientation, erroneous parts mounting, malfunction of parts, defective connection caused by deformation of a parts lead terminal (i.e., parts lead), an open caused by shortage of solder during soldering, and short caused by excessive solder supplying. The same errors exist when the solder material is Pb free, as such, detection of errors in assembly yield important assurances for quality control.

Among various defective conditions detectable by a testing method according to the present invention, part misplacement and orientation error, erroneous parts mounting, and short caused between leads may be described with reference to FIGS. 6 to 9.

Figure 6A:
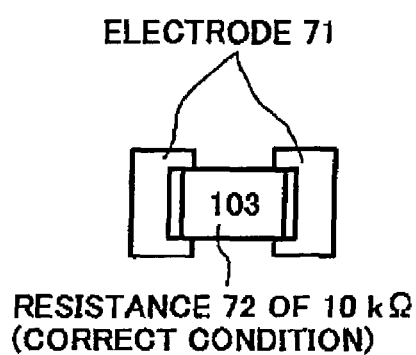
FIGS. 6A and 6B are plan views of components illustrating part misplacement caused during electric circuit baseboard assembling.
Figure 6B:
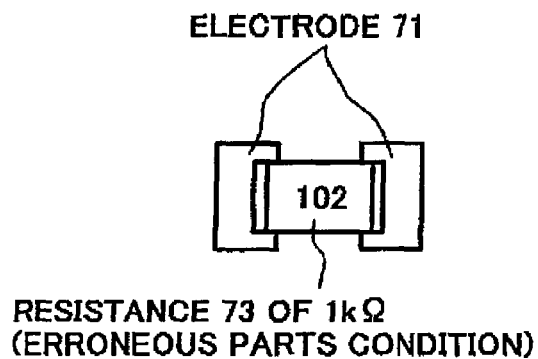

FIGS. 6A and 6B collectively illustrates a parts mix up (part misplacement).

Specifically, FIG. 6A illustrates a case when appropriate parts 72, such as a resistor having 10 kilo-ohm is mounted between a pair of electrodes 71. In contrast, FIG. 6B illustrates a case when an erroneous parts 73 such as a resistor having 1 kΩ is mounted.

Figure 7A:
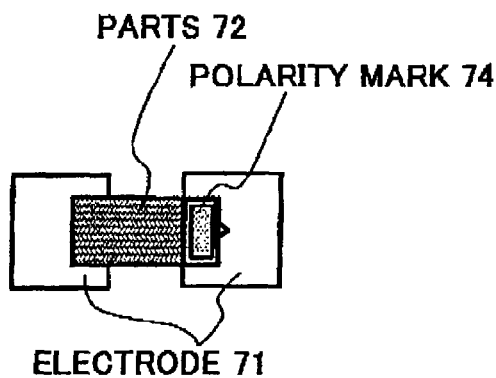
FIGS. 7A and 7B are plan views for illustrating parts orientation error caused during the assembling.
Figure 7B:
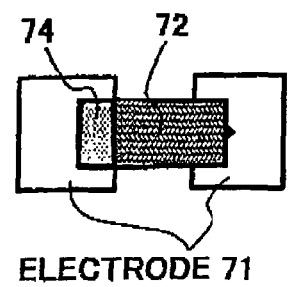

FIGS. 7A and 7B are plan views of a part layout for collectively illustrating parts direction mix up (error in orientation). Specifically, FIG. 7A illustrates a case when an appropriate part 72 is mounted in an appropriate direction between the pair of electrodes 71. In contrast, FIG. 7B illustrates a case when an appropriate parts 72 is mounted in a reverse direction with its polarity being opposite. Numeral number 74 may be a polarity mark indicating a direction.

Figure 8A:
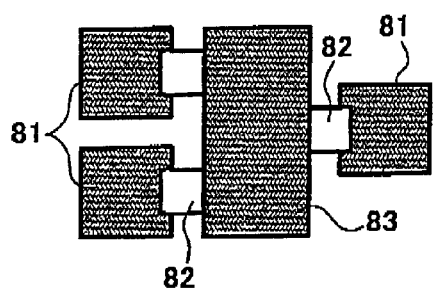
FIGS. 8A and 8B are plan views of a PWB layout for illustrating missing parts caused by an assembly error.
Figure 8B:
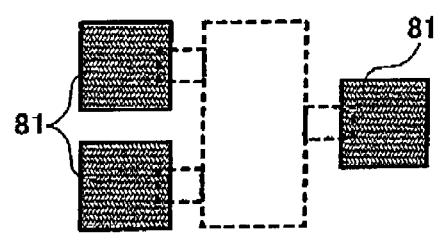
Figure 9A:
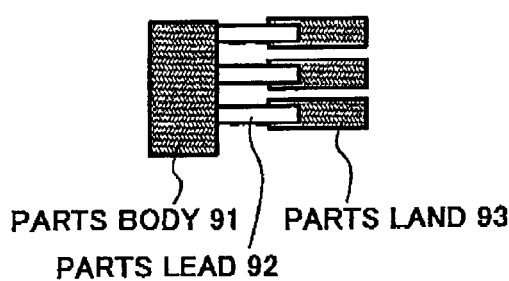
FIGS. 9A and 9B are plan views of a PWB layout for illustrating a short circuit caused when solder is excessively supplied during assembly.
Figure 9B:
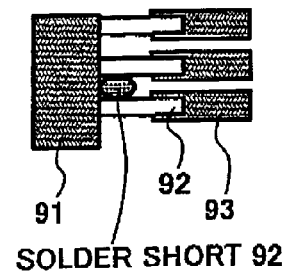

FIGS. 8A and 8B are plan views of a PWB layout for collectively illustrating erroneous parts mounting. FIG. 8A illustrates a case when a parts 83 is connected to plural electrodes 81 in appropriate via its parts leads 82. In contrast, FIG. 8B illustrates a case when a standardized parts is missing on a prescribed position. FIGS. 9A and 9B are plan views of a PWB layout for collectively illustrating short caused by excessively supplied solder. Specifically, FIG. 9A illustrates a fine condition where short does not occur between parts leads 92 connecting a parts body 91 to parts lands 93. In contrast, FIG. 9B illustrates a defective condition where the short occurs due to intervention of the solder 94 between the parts leads 92.

Figure 10C:
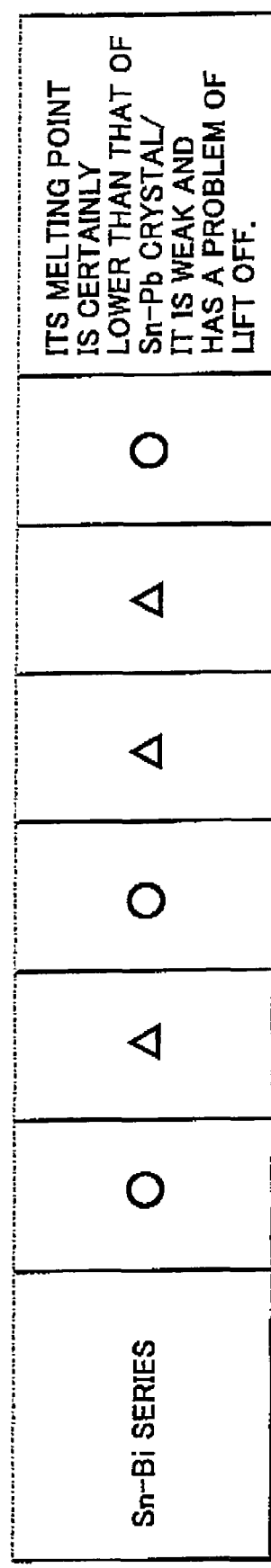

A Pb free Sn—Ag—Cu type solder alloy used in this embodiment has a melting point of 217° C., higher than that of a conventional Sn—Pb alloy of 183° C. It is generally pointed out that a wetting and spreading performance of the former alloy is inferior to average alloy due to the exclusion of Pb. As apparent from FIG. 10, credibility after solder connection of such alloy has been confirmed to be higher in comparison to the other Pb excluded alloy compositions.

Figure 11:
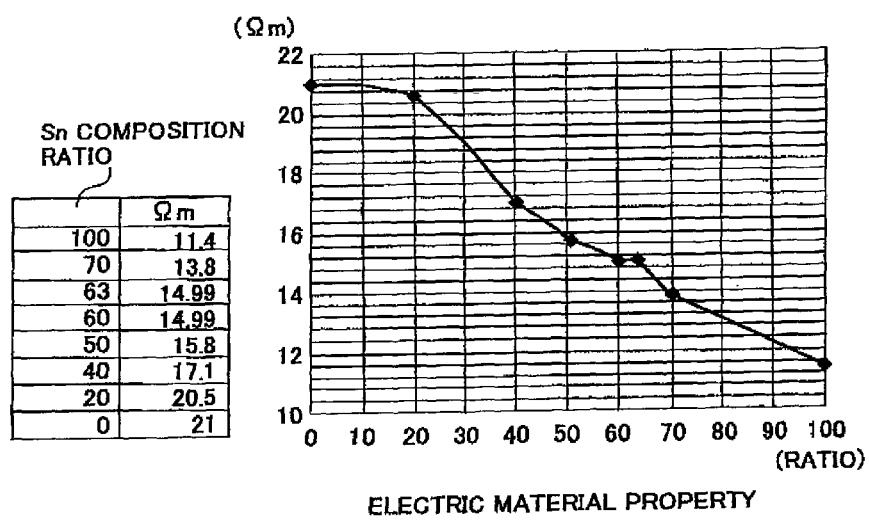
FIG. 11 is a graph for illustrating an electric property of solder material.

Assembling in a higher temperature, and an inferior wetting performance of material relative to conventional materials might collectively hold back an assembling and testing performance. Further, a conventional electric assembly and testing method tests conduction by contacting a probe pin to a prescribed portion of an electronic parts circuit baseboard. In addition, an electric property of material itself as an alloy does not change as illustrated in a graph of FIG. 11. Thus, an assembly and testing can be similarly performed to those of conventional without changing parameter of program executed by an automatic parts conduction testing apparatus. Accordingly, it is considered optimal in terms of efficiency to utilize a Pb free alloy in a parts assembling and testing process according to the present invention when a Pb ratio is expected to be decreased considering a future environmental issue.

Figure 12A:
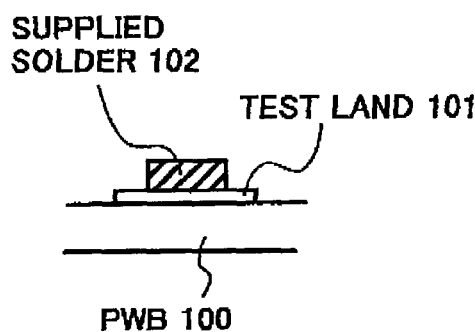
FIGS. 12a and 12B are side views of a PWB for illustrating attitudes of Pb including solder when it is supplied and heated on the test land, respectively in accordance with an exemplary embodiment of the invention.
Figure 12B:
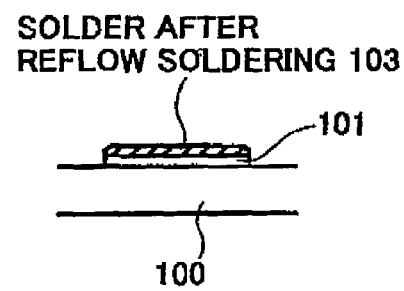

FIGS. 12A and 12B are side views for collectively illustrating an example where a cream solder 102 is coated on a test land 101, which is formed on an electronic circuit baseboard 100 so as to be contacted by a probe pin. When heat soldering is performed at once as a reflow process, such heat soldering may roughly be divide into three steps, such as a cream solder coating step 102, an electronic parts mounting step, and a heat soldering step, performed at once.

In such a process, cream solder may be coated on a probe pin needle contact portion beside a parts connection section during the initial cream solder coating step. Thus, substantially the same material may be utilized in the same step. Simultaneously, prevention from oxidation of a baseboard copper leaf locating at the probe pin contact section (e.g. test land) may be realized.

A second embodiment is now described with reference to FIGS. 12A–12B and 13A–13B. FIGS. 12A and 12B illustrate conditions when a conventional solder material 102 including Pb is supplied and heated on a checker use land 101. Since a wetting performance of a conventional solder is fine, the solder can wet and spread to the entire checker use land during reflow soldering even if the solder is supplied only to a portion thereof as illustrated in FIG. 12A. Thus, a condition of the solder 103 can evenly thinly spread on the entire checker use land 101.

Figure 13A:
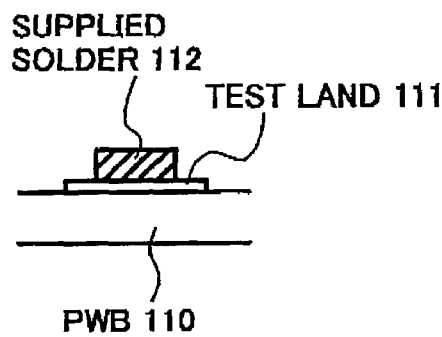
FIGS. 13A and 13B are side views of a PWB for illustrating attitudes of Pb free cream solder when it is supplied and heated on the test land, respectively in accordance with an exemplary embodiment of the invention.
Figure 13B:
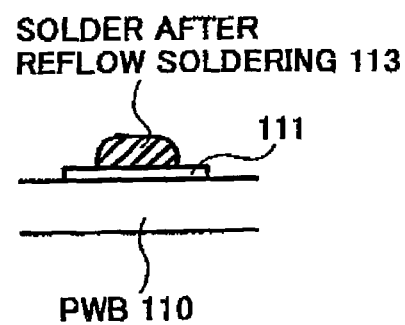

In contrast, FIGS. 13A and 13B illustrate a case when a cream solder excluding Pb is supplied to the test land. As illustrated in FIG. 13B, since a wetting performance of such a cream solder itself is relatively inferior, the cream solder stays in a section of the test land 111 where the cream solder 112 is supplied. Thus, prevention from forming an oxidation coat on the test land may be not entirely covered by such a solder alloy.

In such a situation, if a conventional probe pin is utilized, the oxidation coat inhibits contact depending upon a positional accuracy of the conventional probe pin. Thereby, normal testing is disabled.

Figure 1B:
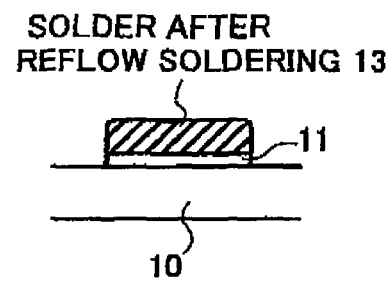
FIG. 1B is a side view of the PWB of FIG. 1 after reflow soldering in accordance with an exemplary embodiment of the invention.

Then, as illustrated in FIG. 1A, a solder 12 excluding Pb and having substantially the same shape to the test land 11 may be supplied in a similar manner to that described in the fist embodiment in order to wholly prevent the oxidation of the copper leaf section and resolve conductivity inferior. Specifically, since the Pb free solder 13 itself is inferior in a wetting performance, the solder 13 remains substantially the same scale to the electrode surface even after reflow soldering is performed as illustrated in FIG. 1B. Thus, the checker use land 11, whose surface is not wholly oxidized, may be obtained. As a result, a conventional type testing apparatus can be utilized and test while avoiding from defective positioning of its probe pin on the checker use land. Of course, another Pb free solder alloy such as Sn—Ag—Cu type may be used in this embodiment.

A third embodiment is now described with reference to FIGS. 2A–2D, FIGS. 2A and 2C each illustrating a side view, FIGS. 2B and 2D each illustrating a plan view. FIGS. 2A–2D illustrate conditions when Pb free soldering is performed both in the atmosphere and inert ambient atmosphere. As there shown, numeral number 20 denotes an electronic part, numeral number 21 denotes a test land, numeral number 22 denotes a copper leaf section, and numeral numbers 23 and 23' denote Pb free solder.

Figure 2A:
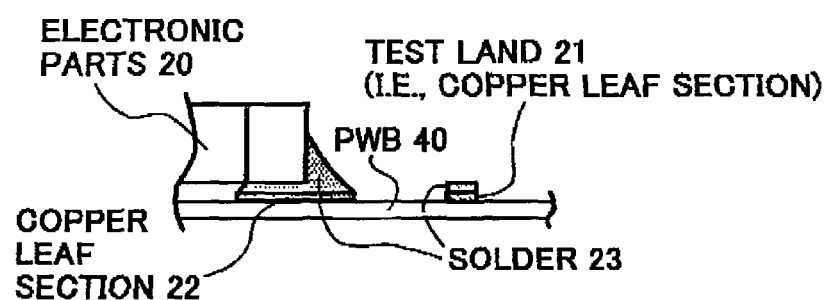
FIG. 2A is a side view of a PWB showing a component attached thereto by soldering under atmospheric conditions in accordance with an exemplary embodiment of the invention.
Figure 2B:
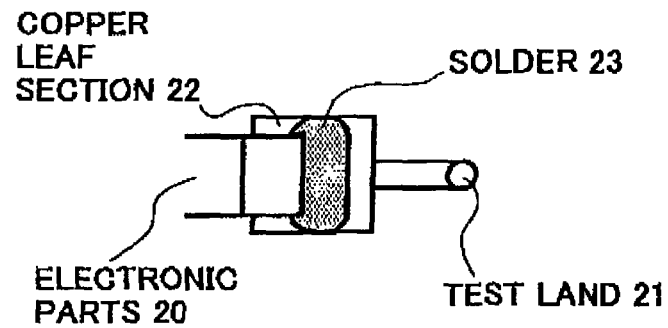
FIG. 2B is a top view of the PWB of FIG. 2A showing a component attached thereto by soldering under atmospheric conditions.
Figure 2C:
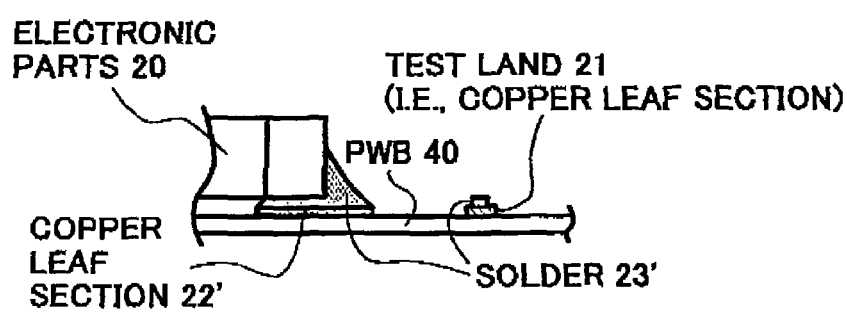
FIG. 2C is a side view of a PWB showing a component attached thereto by soldering under inert ambient atmospheric conditions in accordance with an exemplary embodiment of the invention.
Figure 2D:
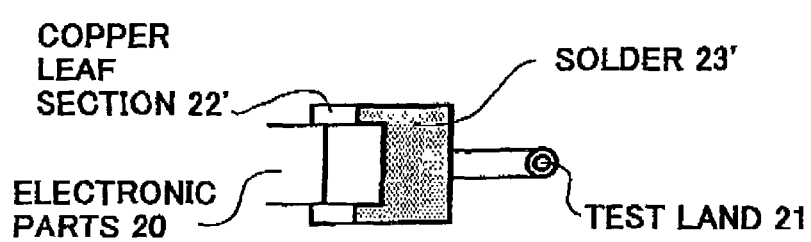
FIG. 2D is a top of the PWB of FIG. 2C showing a component attached thereto by soldering under inert ambient atmospheric conditions.

As illustrated in FIGS. 2A–2B, the Pb free soldering performed in the atmosphere may be inferior in a wetting performance and does not spread due to its surface tension. In contrast, the Pb free soldering performed in the inert ambient atmosphere may extraordinary suppress formation of an oxidation coat due to decreasing in a quantity of oxygen. Specifically, there exists an advantage that decreasing in a wetting performance of the Pb free material can be compensated by stoppage of oxidation growing. Thus, even if solder excluding Pb is utilized, since substantially the same resultant to the Pb including solder excellent at a wetting performance can be obtained as illustrated in FIGS. 2C–2D, the conventional type testing apparatus can be used. In addition, the test may be achieved without fairly precisely positioning the probe pin. Further, a defective conduction may not arise similar to the above-described embodiments.

Figure 3:
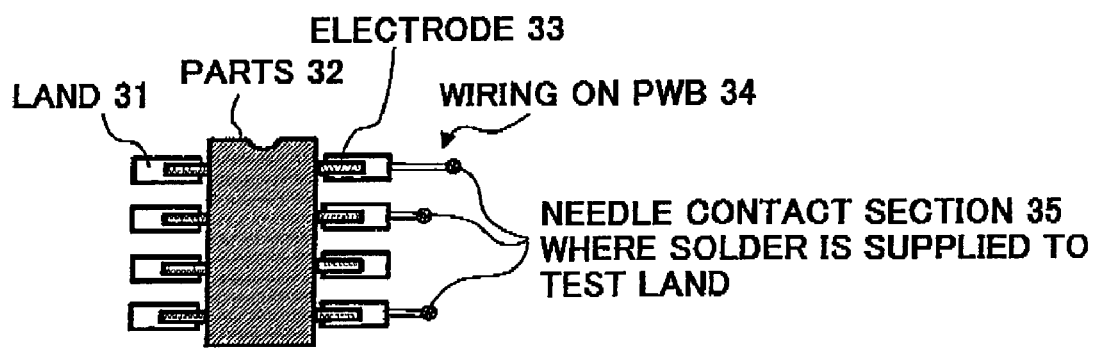
FIG. 3 is a plan view illustrating an example in which so called test use solder is supplied only to a needle contact section contacted by a probe pin.

A fourth embodiment is now described with reference to FIG. 3. As shown, numeral number 33 denotes an electrode. Numeral number 34 denotes wiring on an electronic circuit baseboard. This embodiment may utilize solder excellent at a wetting performance only for a needle contact section of the checker use land, and not for a parts electrode soldering section. Specifically, both of the Pb including and free (Bi is added) solder can be employed while separately utilizing Pb free solder suitable for connection of the parts 32 to the electrode 31, and Pb including solder excellent at a wetting performance and suitable for the probe pin needle contact section 35. As a result, a testing performance may be not sacrificed, while enjoying a Pb decreasing advantage.

Figure 4:
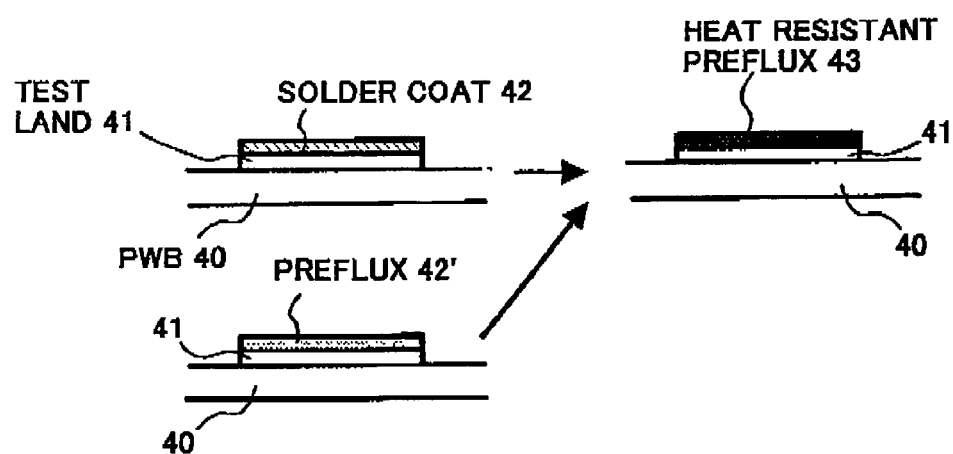
FIG. 4 is a process diagram for illustrating an example in which heat resistant pre-flux is coated on the test land in accordance with an exemplary embodiment of the invention.

A fifth embodiment is now described with reference to FIG. 4. As there shown, numeral number 40 denotes an electronic circuit baseboard. A heat resistant preflux 42' may be mounted on a checker use land 41. In the above-described all of embodiments, in order for a probe pin to prevent from defective contact caused by an oxidation coat formed on the probe pin contact section, it was premised that a surface coat, such as a solder coat 42 made of the solder, preflux 42' etc., is formed on the checker use land 41 as illustrated in FIG. 4A. However, even when Pb excluding material is utilized, a surface coat may be needless to be formed by solder on the probe pin contact section, if a heat resistant baseboard surface coat 43 capable of sufficiently preventing from oxidation at a soldering temperature of the material is formed thereon as illustrated in the right side of FIG. 4. As a heat resistant baseboard surface coat 43, WPF 15™ of Tamura Chemistry Laboratory Co. Ltd., or the like may be exemplified.

A sixth embodiment is now described. Conventional flux used in a soldering operation generally remains some of resin and an activator component on a surface of a soldering section as a solid body in order to remove an oxidation coat and suppress re-oxidation. However when the flux component is replaced with resolvable and evaporative material having a reducing ability, quantity of the flux remaining and sticking to a tip of the probe pin may exceptionally be decreased. As a result, an erroneous judgement due to a defective conduction can be prevented while decreasing labor of cleaning a probe pin.

A seventh embodiment is now described with reference to FIGS. 5A to 5D. FIGS. 5A–5D illustrate various shapes of exemplary probe pins formed in view of a baseboard land shape, a parts electrode shape, and soldering material. As there shown, numeral number 53 may be an electrode section.

Figure 5A:
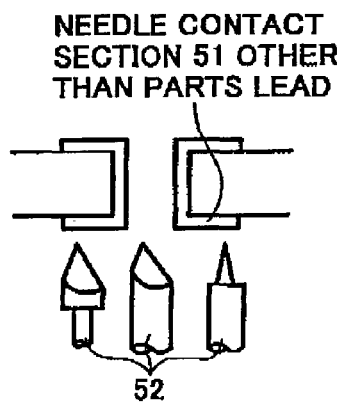
Figure 5B:
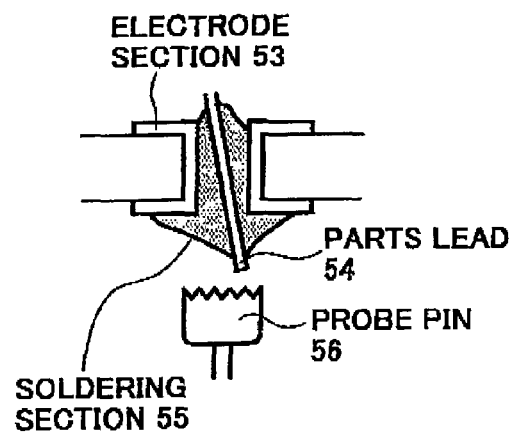

FIG. 5A illustrates a case when conduction is obtained by contacting a probe pin to a needle contact section 51 not having a lead terminal. A tip of the probe pin 52 used in this situation may preferably be a headless corn or needle shape. FIG. 5B illustrates a case when conduction is realized by contacting the probe pin to a parts lead terminal 54 or soldering section 55. A tip of the probe pin 56 used in this situation may preferably have a wave shape.

Figure 5C:
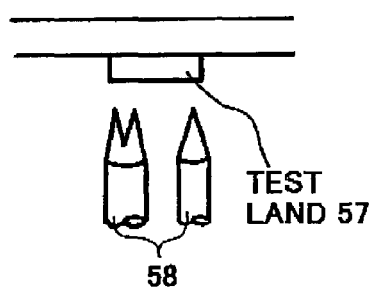
Figure 5D:
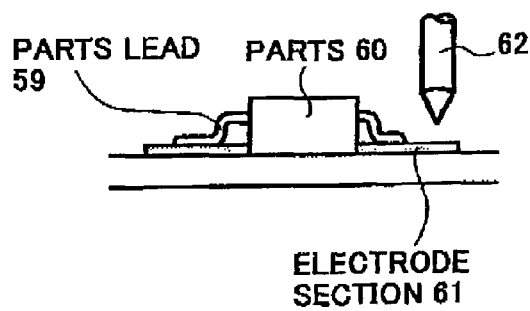

FIG. 5C illustrates a case when the probe pin contacts a test land 57 so as to make conduction. A tip of the probe pin 58 used in this situation may preferably be divided into four pieces or is a needle shape. FIG. 5D illustrates a case when the probe pin contacts an electrode section 61 other than a parts 60 having a parts lead terminal 59 so as to make conduction. A tip of the probe pin 62 used in this situation may preferably be a needle shape. If an oxidation coat is not destructive, the conduction may be obtained by changing tip material or pressure of the probe pin. Thus, using the above-described probe pins 50, 56, 58, and 62 in accordance with a condition of a needle contact section, a testing performance can be improved.

An eighth embodiment may be an electronic circuit baseboard included in an electronic instrument, which is assembled and tested by one of the above-described assembling and testing methods. Thus, the electronic instrument can suppress ill influence of melted Pb to ecology and environment pollution.

A ninth embodiment is now described with reference to FIGS. 14A–14D. FIGS. 14A to 14D collectively illustrate normal and erroneous conditions when a parts is mounted using Pb free solder (e.g. Sn—Ag—Cu type). As shown, numeral number 1 indicates a land. Numeral number 2 indicates an electrode. Numeral number 3 indicates parts. Numeral number 5 indicates solder. Numeral number 6 indicates a flat portion of the solder.

Figure 14A:
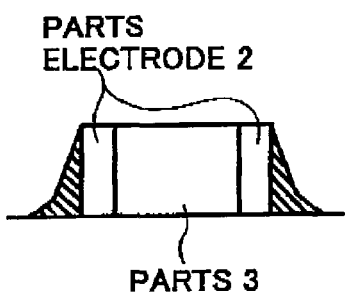
FIGS. 14A and 14B are side views for illustrating conditions when a chip part is soldered with Pb free solder (e.g. a Sn—Ag—Cu type)

FIG. 14A is a side view for illustrating an exemplary solder shape when a part is properly soldered as a superior goods. FIG. 14C is a plan view of the parts, which is taken by a prescribed testing machine (not shown) from the above.

Figure 14B:
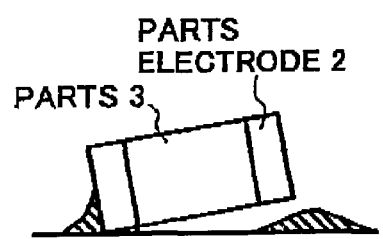
Figure 14C:
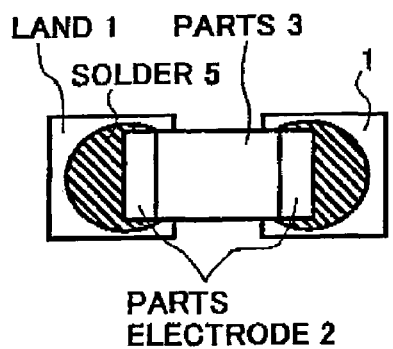
FIGS. 14C and 14D are plan views for illustrating conditions when a chip part is soldered with Pb free solder (e.g. a Sn—Ag—Cu type)
Figure 14D:
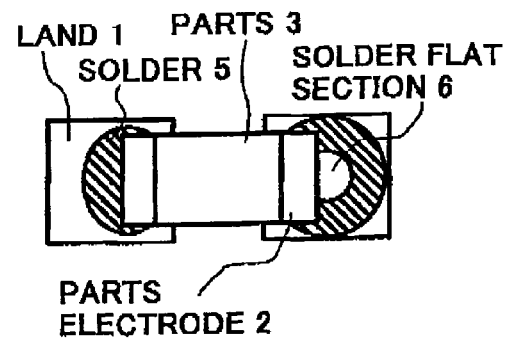

FIG. 14B is a side view for illustrating a solder shape when a parts is erroneously soldered as an inferior goods. As will be apparent therefrom, a one side floating up condition of the parts is illustrated. FIG. 14D is a plan view image of the part, which is taken by the testing machine from the above.

The testing machine may include a camera function for taking a picture or the like and have a processing function for processing a picture image so as to test a soldering quality from appearance after soldering. When soldering is properly performed as an superior goods as illustrated in FIG. 14A, and such an testing machine is utilized, a hatching section may be indicated on a screen or similar by a prescribed color so as to represent solder inclination as illustrated in FIG. 14C. Thus, it can be recognized that soldering is properly performed while wetting and spreading between the parts electrode 2 and baseboard land 1.

In contrast, when the parts are erroneously soldered as illustrated in FIG. 14B as an inferior goods, a prescribed color representing a solder flat portion (i.e., not having inclination) is displayed as illustrated in FIG. 14D in the center of the hatching section. Thus, it can be recognized that soldering is performed while erroneously wetting and spreading to both the parts electrode 2 and baseboard land 1.

Using such a testing machine and manner capable of determining a quality of soldering from its appearance may be efficient when Pb is decreased in view of a future ecology issue.

To obtain a stable solder outside shape, soldering in an inert ambient environment may be considered efficient so as to compensate decreasing in a wetting performance due to oxygen as described earlier.

FIGS. 15A–15D are side and top views for collectively illustrating superior and defective solder conditions around a part electrode of a lead parts. As there shown, numeral number 7 indicates an inclination section of the solder.

Figure 15A:
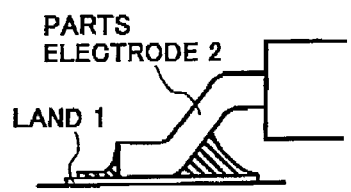
FIGS. 15A is a side view for illustrating various soldering conditions of lead parts.

In particular, FIG. 15A is a side view of the part electrode when soldered in an inert ambient environment. FIG. 15B illustrates a picture when viewed from above the parts using the testing machine. As there shown, a solder wetting performance is improved by the inert ambient environment, and a connecting force of the baseboard land 1 to the parts electrode 2 can be strengthened.

Figure 15C:
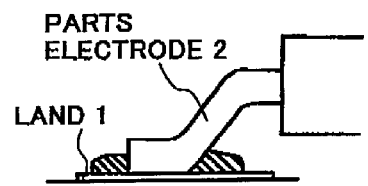
FIG. 15C is a side view for illustrating various soldering conditions of lead parts.
Figure 15B:
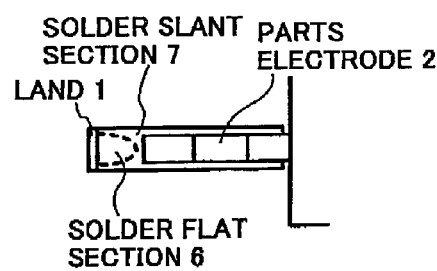
FIG. 15D is a top view of the lead part shown in FIG. 15C.
Figure 15D:
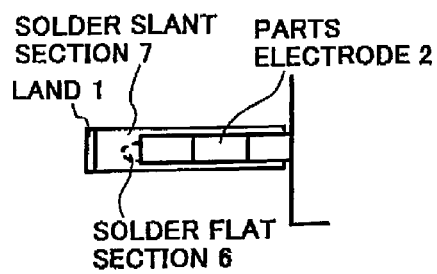

FIG. 15C is a side view of a lead parts when soldered in the atmosphere. FIG. 15D illustrates a picture taken by the testing machine from above the lead parts. It may be recognized from flat and inclination sections 6 and 7 that soldering in the atmosphere less spreads the solder than in the inert ambient environment as described earlier.

Accordingly, spreading of solder to the parts electrode 2 and baseboard land 1 may be more affected by the oxidation caused during soldering than a wetting performance of solder material itself. In addition, it may readily be supposed that oxidation influence extraordinary appears on a solder shape after soldering.

When comparing Pb free (Sn—Ag—Cu) with Pb including solders, substantially the same or slightly different appearances may be presented after soldering. Thus, it may be understood therefrom that a quality can be determined by substantially the same criterion when soldering is performed in the inert ambient environment. Thus, according to the testing from an appearance after soldering, the soldering in the inert ambient environment may be efficient and preferable.

Figure 16:
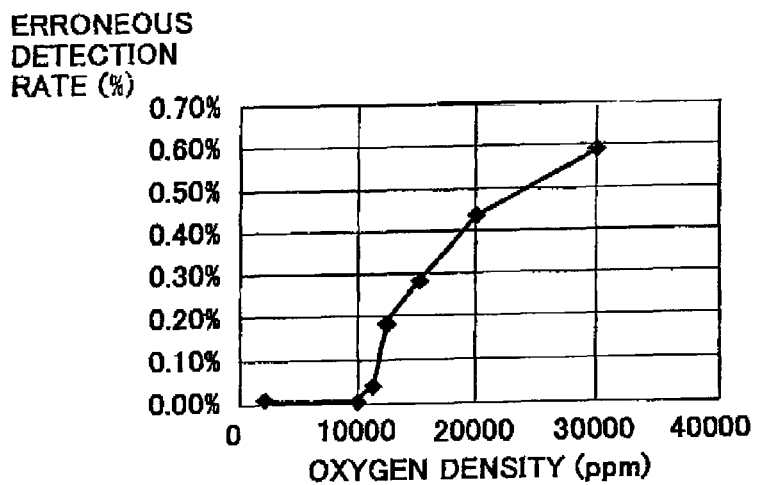
FIG. 16 is a graph for illustrating a relationship between an oxygen density in an inert ambient atmosphere and an erroneous soldering rate.

FIG. 16 is a graph for illustrating a measurement resultant of an erroneous detection rate (a rate when a superior soldering goods is erroneously recognized as an inferior one), which is obtained by changing an oxygen density in various manners. It may represent a relationship between the oxygen density and erroneous detection rate in the inert ambient environment. Thus, as apparent from the graph, the erroneous detection rate sharply increases when the oxygen density is more than 10,000 ppm.

Accordingly, since a similar solder shape to the conventional one can be obtained up to 10,000 ppm of the oxygen density, a solder appearance test can be allowed up to the level using a testing machine similar to the conventional one.

Figure 17A:
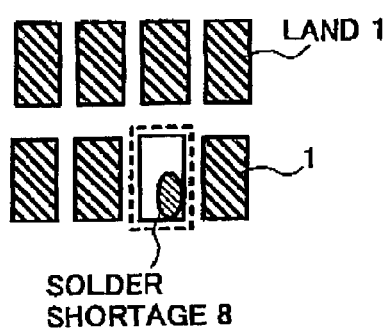
FIGS. 17A and 17B are plan views of a PWB soldering layout for collectively illustrating an open circuit condition caused by shortage of solder.

A tenth embodiment is now described with reference to FIGS. 17A and 17B. The above-described various embodiments describe cases where a test is performed after soldering. However, if soldering is expected to be highly likely abnormally performed, such soldering can be previously detected in order to be adjusted.

Specifically, short (see FIG. 9B) caused by excessive solder supply or an open caused by shortage of solder or the like can be principal defects occurring after soldering. FIGS. 17A and 17B collectively illustrate the open circuit condition. In particular, FIG. 17A illustrates a condition after cream solder is transferred onto a baseboard land 1 through a prescribed pattern mask. FIG. 17B illustrates a condition after soldering a parts. As shown in FIG. 17B, the land supplied with insufficient quantity of the solder as illustrated in FIG. 17A is maintained to be open (i.e., it is not connected to a parts electrode). Either deviation of a solder supplying position and shortage or excessiveness of solder supplying quantity largely contribute to a cause of the above-described inferior.

One example of the open formed during a reflow process that performs solder connection of the parts electrode 2 to the baseboard land 1 at once using a reflow furnace is now specifically described with reference to FIGS. 17a and 17B.

First, cream state solder may be transferred to an electronic circuit baseboard through a printing use mask that includes substantially the same shaped and scaled openings at substantially the same position to lands formed on the baseboard. As shown in FIG. 17A, numeral number 8 denotes a solder shortage section. After that, the parts electrode 2 may be mounted on a desired position. Then, soldering may be performed while heat is applied there so as to fuse the solder. As shown in FIG. 17B, as a result of such soldering, the open 9 may be maintained. Then, a conduction test procedure may be performed.

Figure 17B:
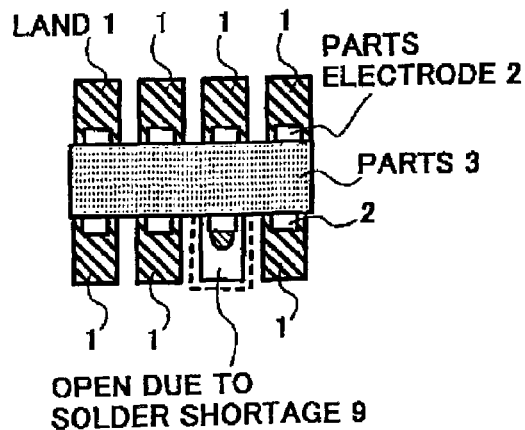

As apparent from FIG. 17B, since a solder quantity is insufficient when the solder is fused, a solder shortage section 8 may form an open 9 due to shortage of the solder. In addition, if a solder transferring position or a solder supply quantity is determined not considering either crush happening after mounting a parts electrode or slack happening during heating and soldering or the like after the solder transfer, short may occur due to the solder.

Then, a solder supplying position or quantity may be previously detected by a prescribed device (not shown) so that a quality of soldering can be predicted and adjusted upon needs. Further, such an assembling and testing method may still be efficient even if the solder is Pb free.

Numerous additional modifications and variations of the present invention are possible in light of the above teachings. It is therefore to be understood that within the scope of the appended claims, the present invention may be practiced otherwise than as specifically described herein.

We claim:

1. A method for assembling and testing an electronic circuit baseboard, comprising the steps of:

mounting at least one electronic parts on the electric circuit baseboard;

soldering the at least one electronic parts to the electronic circuit baseboard using Pb excluding solder; and testing at least one of erroneous wiring, erroneous mounting, malfunction, and defective soldering of the at least one electronic parts by contacting a probe pin to various probe pin contact sections of the electronic circuit baseboard;

wherein said step of soldering includes a step of simultaneously supplying at least two kinds of soldering sections with the Pb excluding solder, said two kinds of soldering sections including an electronic parts soldering section soldering the at least one electronic parts to the electronic circuit baseboard, said electronic parts soldering section being electrically connected to one of the other at least two of the various probe pin contact sections.

2. A method for assembling and testing an electronic circuit baseboard, comprising the steps of:

mounting at least one electronic parts on an electric circuit baseboard;

soldering the at least one electronic parts to the electronic circuit baseboard using Pb excluding solder; and testing at least one of erroneous wiring, erroneous mounting, malfunction, and defective soldering of the at least one electronic parts by contacting a probe pin to various probe pin contact sections directly attached to the electronic circuit baseboard;

wherein a shape of the Pb excluding solder supplied to the one of various probe pin contact sections is substantially the same to that of the one of various probe pin contact sections, said step of soldering includes a step of simultaneously supplying at least two kinds of soldering sections with the Pb excluding solder, and said two kinds of soldering sections including an electronic parts soldering section soldering the at least one electronic parts to the electronic circuit baseboard, said electronic parts soldering section being electrically connected to one of the other at least two kinds of soldering sections.

3. The assembling and testing method according to claim 1, wherein said Pb excluding solder is an alloy including Sn—Ag—Cu type.

4. The assembling and testing method according to claim 1, wherein said step of soldering is performed in an inert ambient atmosphere.

5. The assembling and testing method according to claim 1, wherein Pb including solder of Sn—Pb alloy is supplied to one of various probe pin contact sections other than a parts electrode soldering section.

6. The assembling and testing method according to claim 1, wherein Pb excluding solder having substantially the same wetting performance to that of the Pb including solder is supplied to the one of the various probe pin contact sections other than the parts electrode soldering section.

7. The assembling and testing method according to claim 1, further including a step of coating highly heat resistant pre-flux on at least one of probe pin contact sections so as to prevent oxidation.

8. The assembling and testing method according to claim 1, wherein said step of soldering is performed using decomposable and evaporative flux having an oxidation-reduction function.

9. The assembling and testing method according to claim 1, wherein said step of testing is performed selectively using various shapes of probe pins in accordance with a condition of one of the probe pin contact sections of a lead parts, a surface mounting parts, and the solder.

* * * * *